(12) United States Patent
Redfield et al.

(10) Patent No.: US 7,140,924 B2
(45) Date of Patent: Nov. 28, 2006

(54) COMPENSATION SYSTEM AND METHOD FOR NEGATIVE CAPACITIVE COUPLING IN IDC

(75) Inventors: John M. Redfield, Brier, WA (US); Jeffrey P. Seefried, Everett, WA (US)

(73) Assignee: Leviton Manufacturing Co., Inc., Little Neck, NY (US)

( * ) Notice: Subject to any disclaimer, the term of this patent is extended or adjusted under 35 U.S.C. 154(b) by 0 days.

(21) Appl. No.: 10/995,064

(22) Filed: Nov. 22, 2004

(65) Prior Publication Data

US 2005/0136729 A1    Jun. 23, 2005

Related U.S. Application Data

(60) Provisional application No. 60/524,299, filed on Nov. 21, 2003.

(51) Int. Cl.
*H01R 24/00* (2006.01)
(52) U.S. Cl. ...................................................... 439/676
(58) Field of Classification Search ................ 439/404, 439/403, 941, 676
See application file for complete search history.

(56) References Cited

U.S. PATENT DOCUMENTS

| | | | |
|---|---|---|---|
| 5,310,363 A | | 5/1994 | Brownell et al. |
| 5,459,643 A | * | 10/1995 | Siemon et al. ............. 361/785 |
| 6,176,742 B1 | | 1/2001 | Arnett et al. |
| 6,186,834 B1 | | 2/2001 | Arnett et al. |
| 6,196,880 B1 | | 3/2001 | Goodrich et al. |
| 6,244,906 B1 | | 6/2001 | Hashim et al. |
| 6,244,907 B1 | | 6/2001 | Arnett |
| 6,270,381 B1 | | 8/2001 | Adriaenssens et al. |
| 6,276,954 B1 | | 8/2001 | Arnett et al. |
| 6,290,546 B1 | | 9/2001 | Pharney |
| 6,305,950 B1 | | 10/2001 | Doorhy |
| 6,350,158 B1 | | 2/2002 | Arnett et al. |
| 6,371,793 B1 | | 4/2002 | Doorhy et al. |
| 6,402,560 B1 | | 6/2002 | Lin |
| 6,443,777 B1 | | 9/2002 | McCurdy et al. |
| 6,464,541 B1 | | 10/2002 | Hashim et al. |
| 6,530,810 B1 | | 3/2003 | Goodrich et al. |
| 6,547,604 B1 | | 4/2003 | Arnett et al. |
| 6,559,649 B1 | | 5/2003 | Deleu et al. |
| 6,663,436 B1 | | 12/2003 | Arnett et al. |
| 6,695,649 B1 | | 2/2004 | Ciezak et al. |
| RE38,519 E | * | 5/2004 | Doorhy et al. ............. 439/404 |
| 6,729,899 B1 | * | 5/2004 | Aekins et al. ............. 439/404 |
| 6,736,680 B1 | | 5/2004 | Slack et al. |
| 6,736,681 B1 | | 5/2004 | Arnett |
| 6,739,898 B1 | | 5/2004 | Ma et al. |
| 6,746,283 B1 | | 6/2004 | Arnett et al. |
| 6,749,466 B1 | | 6/2004 | Milner et al. |
| 6,758,698 B1 | | 7/2004 | Caveney et al. |
| 6,764,333 B1 | | 7/2004 | Pocrass |
| 6,764,348 B1 | | 7/2004 | Han et al. |
| 6,767,257 B1 | | 7/2004 | Arnett et al. |
| 6,783,402 B1 | | 8/2004 | Chen |
| 6,786,772 B1 | | 9/2004 | Liu |
| 6,786,775 B1 | | 9/2004 | Hanrahan et al. |

(Continued)

*Primary Examiner*—Chandrika Prasad
(74) *Attorney, Agent, or Firm*—Brian L. Johnson; George C. Rondeau, Jr.; Davis Wright Tremaine LLP

(57) ABSTRACT

A insulation displacement connector (IDC) patch panel includes a circuit (PC) board with interdigitated capacitance for balancing out inherent capacitance found within IDCs of the panel. Unwanted cross-talk signals are reduced as a consequence.

6 Claims, 12 Drawing Sheets

U.S. PATENT DOCUMENTS

| | | |
|---|---|---|
| 6,796,847 B1 | 9/2004 | AbuGhazaleh et al. |
| 6,923,673 B1 * | 8/2005 | Doorhy et al. ............... 439/404 |
| 2002/0160662 A1 | 10/2002 | Arnett et al. |
| 2004/0082227 A1 | 4/2004 | Hashim |
| 2004/0092154 A1 * | 5/2004 | Doorhy et al. ............... 439/404 |
| 2004/0102099 A1 | 5/2004 | Han et al. |
| 2004/0137799 A1 | 7/2004 | Ciezak et al. |
| 2004/0157497 A1 | 8/2004 | Colantuono et al. |
| 2005/0106946 A1 * | 5/2005 | Doorhy et al. ............... 439/676 |
| 2005/0250372 A1 * | 11/2005 | Doorhy et al. ............... 439/404 |
| 2006/0160428 A1 * | 7/2006 | Hashim ...................... 439/676 |

* cited by examiner

LAMINATION SEQUENCE

12 # COMPENSATION SYSTEM AND METHOD FOR NEGATIVE CAPACITIVE COUPLING IN IDC

BACKGROUND OF THE INVENTION

1. Field of the Invention

The present invention is directed to communication connectors, and, more specifically, to a communication connector with improved crosstalk reduction.

2. Description of the Related Art

The widespread use of communication devices has spurred the development of communication connectors. Initially, communication devices such as telephones, computer terminals, and the like were hardwired. For example, the wire cable for a telephone was coupled directly through a hole in a wall plate to electrical terminals.

Modern telephone connectors use an industry standard receptacle mounted in the wall and a mating industry standard plug at the end of a telephone cord. The use of industry standard connectors permits the convenient installation of telephones. Similarly, industry standard connectors have been developed for other communication devices such as computers. For example, a personal computer may be coupled to a local area network (LAN) via a communication connector similar to those used with telephones.

The use of communication connectors with telephones does not result in the degradation of signal quality because telephones typically have limited bandwidth. However, high-speed communication devices, such as computers, can suffer significant degradation of signal quality due to conditions such as crosstalk occurring where a signal on a line pair interferes with a signal on another line pair.

Conventional insulation displacement connector (IDC) designs have associated capacitive and inductive crosstalk that hinders efforts to comply with sophisticated communication standards. Past attempts to satisfy Category 6 communication standards have sought to reduce the detrimental effects potentially caused by IDCs through use of configurations for the IDC different than the configurations for the conventional IDCs. Having different IDC configurations can be undesirable, however, since other problems can be introduced including those involved with equipment logistics and support.

BRIEF SUMMARY OF THE INVENTION

The present invention resides in a patch panel crosstalk reduction system and method. Aspects are for a at least one plug connector, the plug connector having a plurality of plug connector elements being grouped into pairs, including first and second pairs, each pair of the plurality of plug connector elements having a tip plug connector element and a ring plug connector element configured to be coupled to a different wire pair. Aspects include a jack connector shaped to receive the plug connector. The jack connector has a plurality of jack contact members and is configured to receive the plug connector such that each of the plurality of jack contact members is electrically coupled to a different one of the plurality of plug connector elements. The plurality of jack contact members includes a first tip jack contact member and a first ring jack contact member positioned to electrically couple with the tip plug connector element and the ring plug connector element, respectively, of the first pair of the plurality of plug connector elements when the jack connector receives the plug connector, and a second tip jack contact member and a second ring jack contact member positioned to electrically couple with the tip plug connector element and the ring plug connector element, respectively, of the second pair of plug connector elements when the jack connector receives the plug connector.

An insulation displacement connector (IDC) is configured to receive a plurality of wires and have a plurality of IDC elements, each of the plurality of IDC elements is configured to be coupled to a different one of the plurality of wires. The plurality of IDC elements is grouped into pairs. Each pair of the plurality of IDC elements has a tip IDC element and a ring IDC element configured to be coupled to a different wire pair. A first pair of IDC elements has a first tip IDC element and a first ring IDC element. A second pair of IDC elements has a second tip IDC element and a second ring IDC element. The first ring IDC element and the second tip IDC element are adjacent to each other and have a first capacitance therebetween.

A circuit board has a plurality of jack pads, a plurality of IDC pads, and a plurality of internal conductors. Each of the plurality of jack pads are electrically coupled to a different one of the plurality of jack contact members so that a first tip jack pad, a first ring jack pad, a second tip jack pad, and a second ring jack pad are electrically coupled to the first tip jack contact member, the first ring jack contact member, the second tip jack contact member, and the second ring jack contact member, respectively. Each of the plurality of IDC pads are electrically coupled to a different one of the plurality of IDC elements. Each of the plurality of internal conductors are electrically coupled to a different one of the plurality of jack pads and a different one of the plurality of IDC pads. The circuit board has a first interdigitated capacitance electrically coupled to the first tip IDC element and electrically coupled to the second tip IDC element and has a second interdigitated capacitance electrically coupled to the first ring IDC element and electrically coupled to the second ring IDC element. The first interdigitated capacitance and the second interdigitated capacitance is sized to reduce crosstalk associated with the first capacitance.

Other features and advantages of the invention will become apparent from the following detailed description, taken in conjunction with the accompanying drawings.

BRIEF DESCRIPTION OF THE SEVERAL VIEWS OF THE DRAWING(S)

DETAILED DESCRIPTION OF THE INVENTION

Figure 1A:
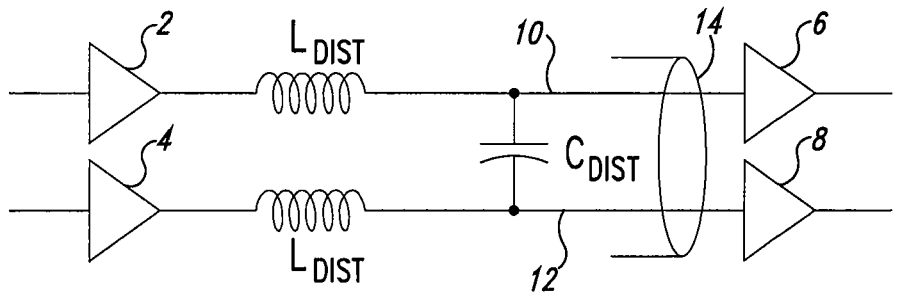
FIG. 1A is a schematic diagram illustrating a conventional communication transmission system.

A patch panel with crosstalk reduction system and method is described herein to meet category 6 requirements while allowing for physical connector configurations that are compatible with other standards such as category 5 and category 5e. The development of a category 6 component compliant patch panel per TIA-568-B.2-1 standards for near-end crosstalk (NEXT) includes addressing crosstalk created in the associated RJ-45 plug and applying cancellation techniques in a jack position of a patch panel module so that the NEXT of the connector satisfies the specification. Conventional IDCs introduce a certain amount of crosstalk that must be dealt with in addition to the crosstalk created in the RJ-45 plug. Conventional category 6 designs reduce the impact of the IDC by changing the IDC to a non-standard configuration. For instance, in some conventional approaches, the spacing between pairs of IDC contacts are increased, which minimizes the capacitive crosstalk. In these approaches, the space between individual contacts in a pair is also decreased, which along with the larger spacing between pairs, decreases inductive crosstalk.

The present patch panel system with crosstalk reduction system and method uses a approach to reduce the impact of the IDC to meet category 6 requirements so that these configuration changes of conventional approaches do not have to be used. In particular, for some of the present implementations, IDC contact spacing is 0.150 inches witth a spacing tolerance of plus or minus 0.005 inches, which is an industry standard spacing used for IDCs such as with category 5 compliant IDCs and other IDCs. With this industry standard spacing, these present implementations of IDCS are able to meet present Category 6 requirements (TIA 568-B.2-1 Commercial Building Telecommunications Cabling Standard, Part 2: Balanced Twisted-Pair Cabling Components, Addendum 1: Transmission Performance Specifications for 4-Pair Category 6 Cabling) for Near End Cross Talk (NEXT). In particular, to pass this Category 6 specification, NEXT of a system having a plug connector 40 (described below, see FIG. 2A) coupled with a patch panel 100 (described below, see FIG. 3) must be less than (more negative) or equal to a NEXT limit line for frequencies from 1 to 250 MHz described by the following NEXT limit line equation:

NEXT limit line (dB)=−(54−20*log(f/100)) wherein f represents frequency in MHz for the range of f from 1 to 250 MHz and wherein for any first frequency between 1 to 250 MHz where the NEXT limit line equation yields a result that is less than −75 dB, the Next limit line for the first frequency is equal to −75 dB.

As described further below, steps are taken to directly address those pin pairs that are most influenced by the capacitive properties of the IDC.

Communication connectors offer easy and reliable connections for a variety of communication devices. A conventional communication transmission system is illustrated in the schematic diagram of FIG. 1A. The transmission system includes line drivers 2 and 4 and corresponding line receivers 6 and 8. A wire conductor 10 connects the line driver 2 to the line receiver 6. A wire conductor 12 connects the line driver 4 to the line receiver 8. FIG. 1A illustrates the wire conductors 10 and 12 as single conductors, which are typically bundled together as portions of a cable 14.

The wire conductors 10 and 12 are generally twisted in a parallel fashion to each other for the length of the cable 14. A capacitance CDIST and inductance LDIST are shown in FIG. 1A to model a distributed capacitive and inductive coupling between the wire conductors 10 and 12. A mutual inductance between the two inductances LDIST and the capacitance CDIST contributes to the coupling of electrical signals between the wire conductors 10 and 12. The signal that is coupled capacitively or inductively between conductors is an undesirable signal that may be termed a "leakage" signal or "crosstalk." At low frequencies, such as are typical in a telephone, the crosstalk between the wire conductors 10 and 12 is minimal because the distributed capacitance CDIST and inductance LDIST provide low coupling at such low frequencies. However, at higher frequencies, the crosstalk between the wire conductors 10 and 12 becomes significant.

Figure 1B:
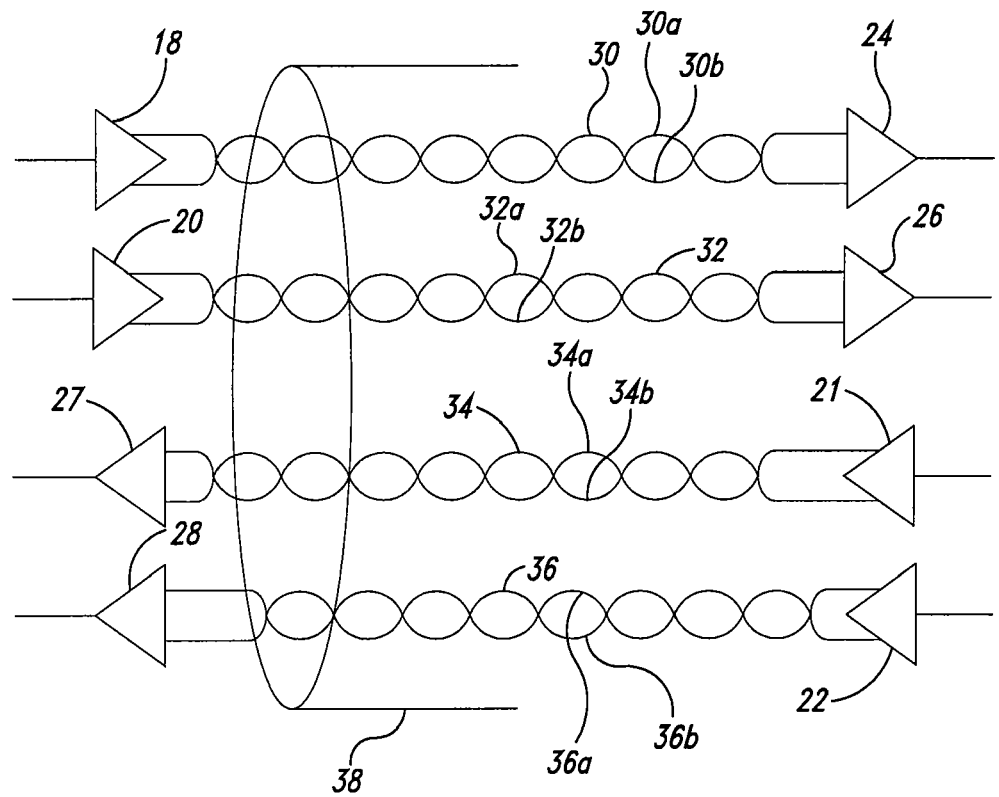
FIG. 1B is a schematic diagram illustrating a conventional technique for transmission of communication signals using differential circuitry and a twisted pair wire cable.

To minimize crosstalk, designers often use twisted pair cables and differential amplifiers, such as illustrated in FIG. 1B. FIG. 1B includes differential line drivers 18, 20, 21 and 22, which are coupled to differential line receivers 24, 26, 27 and 28, respectively. The differential line driver 18 is coupled to the differential line receiver 24 by a twisted pair cable 30 having a "tip" wire 30a and a "ring" wire 30b. Similarly, a twisted pair cable 32, having a "tip" wire 32a and a "ring" wire 32b, couples the differential line driver 20 to the differential line receiver 26, a twisted pair cable 34 having a "tip" wire 34a and a "ring" wire 34b couples the differential line driver 21 to the differential line receiver 27, and a twisted pair cable 36 having a "tip" wire 36a and a "ring" wire 36b couples the differential line driver 22 to the differential line receiver 28. The twisted pair cables 30–36 are typically referred to as twisted wire pairs or wire pairs (possibly not all portions being twisted) and are portions of a cable 38. Each of the twisted pair cables 30–36 may be individually shielded to provide additional protection from crosstalk.

As is known in the art, the differential line receivers 24–28 are designed to reject signals that are present on both conductors of their respective twisted pair cables 30–36. The degree to which the differential line receivers 24–28 can reject these "common mode" signals is indicated by a common mode rejection ratio (CMRR). The system illustrated in FIG. 1B is an improvement over that illustrated in FIG. 1A because crosstalk between the twisted pair cables is canceled out by the CMRR of the differential line receivers. For example, a signal transmitted over the twisted pair cable 34 may be capacitively and inductively coupled to the twisted pair cable 30. However, the capacitive coupling between the "tip" wire 34a and the "ring" wire 34b associated with the twisted pair cable 34 is substantially equal to the capacitive coupling associated with the "tip" wire 30a and the "ring" wire 30b of the twisted pair cable 30. The common mode rejection of the differential line receiver 24 effectively cancels the common mode crosstalk signal. Thus, the twisted pair conductors permit the transmission of data at a significantly higher bandwidth while reducing crosstalk to an acceptable level.

Figure 2A:
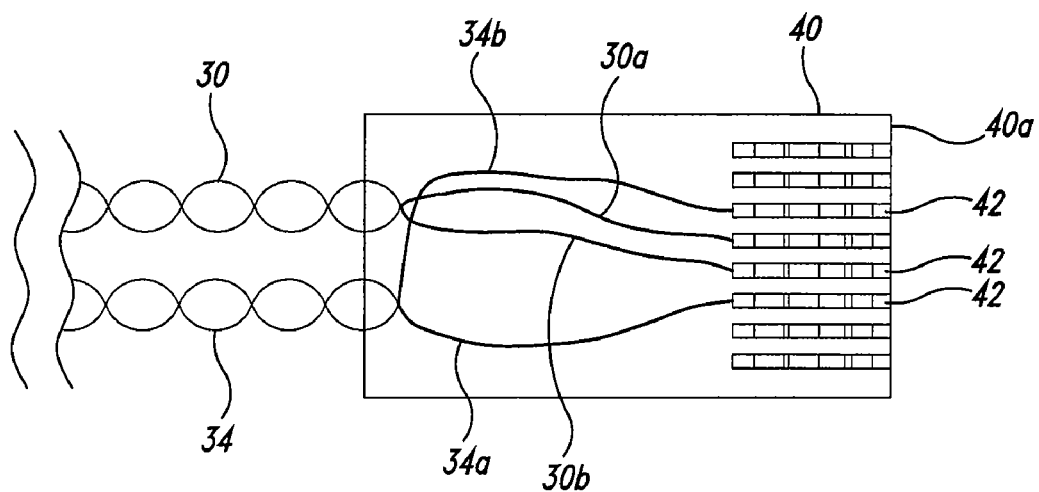
FIG. 2A is a schematic diagram of a conventional plug connector for use with the twisted pair wire cable of FIG. 1B.
Figure 2B:
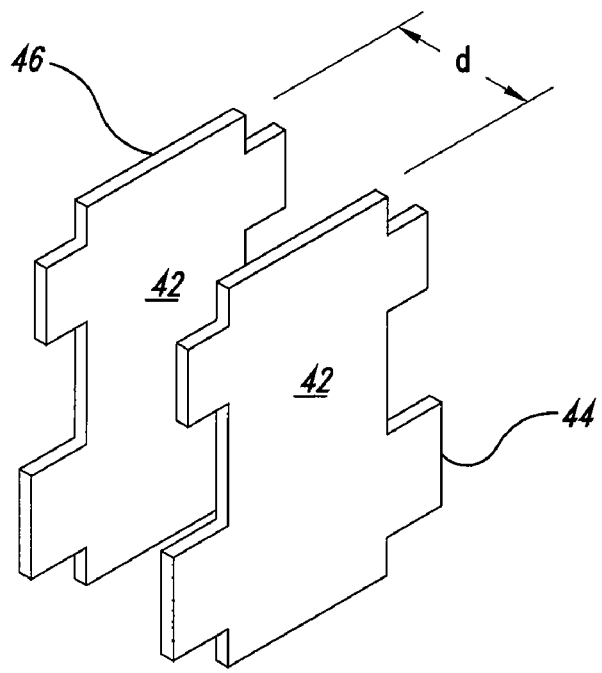
FIG. 2B is a perspective view of plug connector elements of the conventional plug connector of FIG. 2A.
Figure 2C:
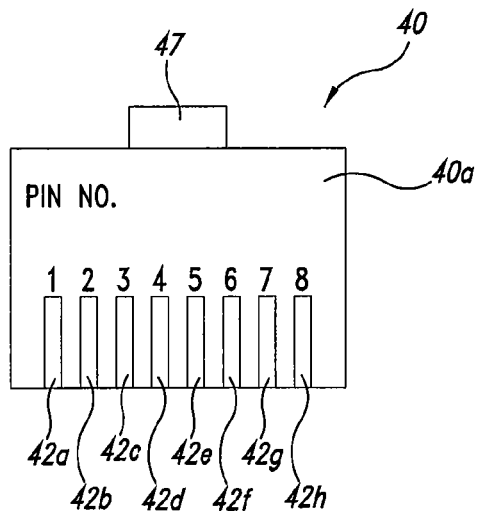
FIG. 2C is a front schematic view of the conventional plug connector of FIG. 2A showing pin assignment and configuration of the plug connector elements.
Figure 2D:
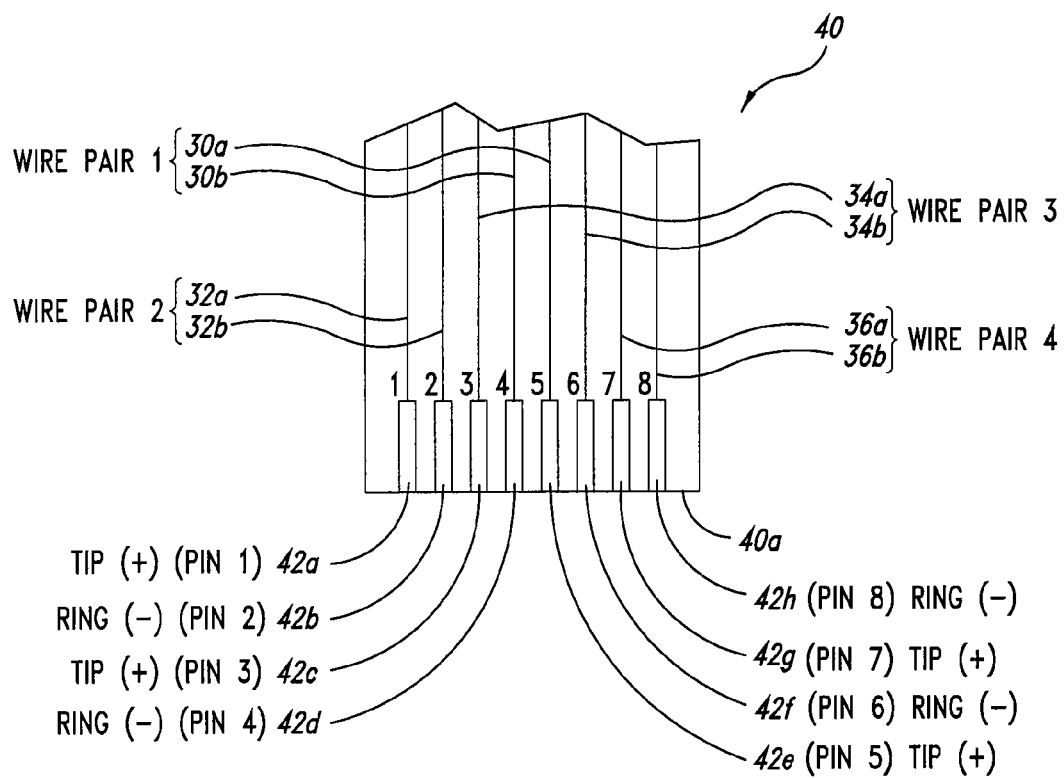
FIG. 2D is a top schematic sectional view of the conventional plug connector of FIG. 2A showing the wire pairs associated with the plug connector elements shown in FIG. 2C.
Figure 2E:
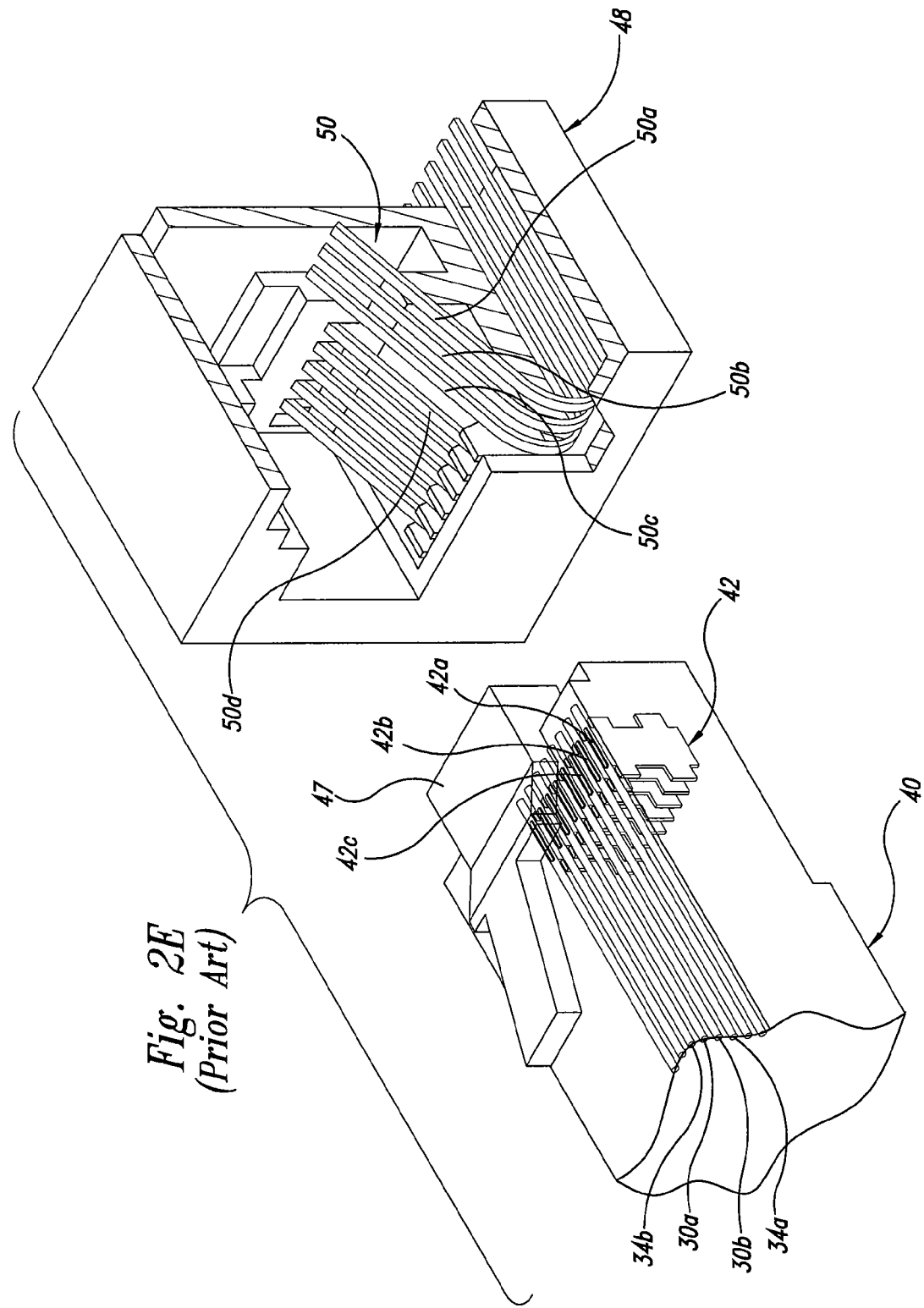
FIG. 2E is an isometric sectional view of the conventional plug connector and associated conventional mating communication jack connector.

The twisted pair conductors are typically terminated in a conventional plug connector 40, as illustrated in FIGS. 2A and 2C or a conventional communication jack adapter 48, as illustrated in FIG. 2E. FIG. 2A illustrates an industry standard RJ45 plug, which accommodates four sets of twisted pair cables (i.e., 8 wires). For the sake of simplicity, FIG. 2A only illustrates the connection of the innermost positioned two twisted pair cables 30 and 34. The plug connector 40 couples with the conventional compatible mating communication jack connector 48 (shown in FIG. 2E) having contact members 50 in a manner well known in the art.

Implementations of the plug connector 40 include a plurality of metal contact or plug connector elements 42, as best shown in FIGS. 2B and 2E, to electrically connect the wire conductors of the twisted pair cables 30 and 34 to the mating conventional communication jack connector 48. The plug connector elements 42 may be plates, resilient wires or take other conventional forms. The twisted pair cable 30 comprises two individual wires occupying center positions within the plug connector 40, with the center "tip" wire 30a and the center "ring" wire 30b being untwisted within the plug connector 40 to permit their electrical connection to two corresponding plug connector elements 42. Similarly, the twisted pair cable 34 comprises the two individual wires occupying a split position within the plug connector 40, with the split "tip" wire 34a and the split "ring" wire 34b also being untwisted within the plug connector 40 to permit their electrical connection to two corresponding plug connector elements 42. With the industry standard RJ45 plug, the center "tip" wire 30a and the center "ring" wire 30b of the twisted pair cable 30 are coupled to the innermost pair of the plug connector elements 42 of the plug connector 40. The split "tip" wire 34a of the twisted pair cable 34 is coupled to the plug connector element 42 on one side of the center "tip" wire 30a and the center "ring" wire 30b, while the split "ring" wire 34b is coupled to the plug connector element 42 on the opposite side of the center "tip" wire 30a and the center "ring" wire 30b. In this configuration, the untwisted center "tip" wire 30a and the center "ring" wire 30b of the twisted pair cable 30 run inside and generally along side to the untwisted split "tip" wire 34a and the split "ring" wire 34b of the twisted pair cable 34, as illustrated in FIG. 2A. As shown in FIG. 2C, the plug connector elements 42 are exposed along a front face 40a of the plug connector 40 for electrical coupling using a tab 47 to secure engagement with the communication jack connector 48.

Because portions of the twisted pair cables 30 and 34 are untwisted within the plug connector 40, the individual center "tip" wire 30a and the center "ring" wire 30b may be differentially exposed to crosstalk from untwisted wires of the twisted pair cable 34 as well as the untwisted wires of the twisted pair cables 32 and 36 (not illustrated in FIG. 2A). That is, the crosstalk from the twisted pair cables 32, 34, and 36 may not occur equally in the individual center "tip" wire 30a and the center "ring" wire 30b in the portion of the twisted pair cable 30 that is untwisted. An industry testing standard, designated as TIA 568A, utilizes an RJ45 plug as a standard plug while testing hardware including category 5, category 5e, and category 6 communication systems. Furthermore, TIA-568-B.2-1 also involves category 6 performance requirements of patch panel modules for component rated connecting hardware. A worst case crosstalk condition for crosstalk on an RJ45 plug occurs between the twisted pair cable 30 and the twisted pair cable 34 illustrated in FIG. 2A. The untwisted center "tip" wire 30a and the center "ring" wire 30b are coupled to the innermost plug connector elements 42 of the plug connector 40 while the untwisted split "tip" wire 34a and the split "ring" wire 34b are separated and coupled to the plug connector elements 42 on opposite outer sides of the innermost plug connector elements 42 such that the center "tip" wire 30a and the center "ring" wire 30b are located intermediate the split "tip" wire 34a and the split "ring" wire 34b. Measurements of this worst case condition have indicated that the crosstalk between the individual wires of the twisted pair cables 30 and 34 while in an untwisted state result in a signal-to-crosstalk level of approximately 40 decibels (dB) at 100 megahertz (MHz). Under these circumstances, the differential signal caused by the leakage is significant and cannot be canceled by a differential line receiver. While other wires within the RJ45 plug have a different signal-to-crosstalk level ratio, there is still an appreciable differential signal caused by leakage among the various wire conductors in the untwisted portion within the plug connector 40.

Crosstalk in the conventional plug connector 40 is also caused by the physical construction of the plug connector elements 42 and the materials used in the construction of the communication connector. FIG. 2B illustrates one implementation for a pair of the plug connector elements 42, each having a solid metal plate with a contact surface 44 and a terminal surface 46. The contact surface 44 is used to couple the connector elements 42 to the wire cable while the terminating surface 46 is used to couple the connector elements to the mating connector. The industry standard RJ45 plug contains eight plug connector elements 42. However, for the sake of simplicity, FIG. 2B illustrates only two plug connector elements 42. This construction of the plug connector elements 42 can add to the crosstalk experienced.

The plug connector elements 42 are mounted within the plug connector 40 and are arranged parallel to each other and spaced apart at a distance d. Each of the plug connector elements 42 acts much as a plate in a parallel plate capacitor. As is known to those of ordinary skill in the art, the capacitance formed between the plug connector elements 42 is directly proportional to the surface area of the plug connector elements and is inversely proportional to the square of the distance d separating the plug connector elements.

The conventional plug connector 40 is molded from a polycarbonate material. Each of the plug connector elements 42 is embedded in the polycarbonate material when the plug connector 40 is manufactured. The capacitance between the plug connector elements 42 is increased through the use of this dielectric material between the connector elements. Therefore, the capacitance between the individual plug connector elements 42 is increased by virtue of the parallel surface areas of the plug connector elements and the high dielectric constant value of the polycarbonate material between them. Thus, while the plug connector 40 provides a simple and inexpensive connection method, it results in decreased performance due to crosstalk between the conductors within the body of the plug connector and the capacitance coupling between the plug connector elements themselves.

The plug connector 40 is shown in FIGS. 2C and 2D as having plug connector elements 42a–42h. As shown from a view of a front face 40a of the plug connector 40 in FIG. 2C, the plug connector elements 42a–42h are arranged according to a pin number 1 through 8, respectively. As discussed, the plug connector elements 42a–42h are wired to the "tip"

wires and the "ring" wires of the twisted pair cables 30–36. As shown in FIG. 2D, the center "tip" and "ring" wires 30a and 30b, designated as wire pair 1, are electrically connected to the pin 5 and pin 4 plug connector elements 42e and 42d, respectively. The pin 1 and pin 2 plug connector elements 42a and 42b are electrically connected to left outside "tip" and "ring" wires 32a and 32b, respectively, designated as wire pair 2. The pin 3 and pin 6 plug connector elements 42c and 42f are electrically connected to the split "tip" and "ring" wires 34a and 34b, respectively, designated as wire pair 3. The pin 7 and pin 8 plug connector elements 42g and 42h are electrically connected to the right outside "tip" and "ring" wires 36a and 36b, respectively, designated as wire pair 4.

The conventional communication jack connector 48 is also likely to introduce crosstalk as well. An implementation of its contact members 50, as illustrated by the four contact members 50a–50d, are configured in a parallel arrangement as shown in FIG. 2E and allow crosstalk to occur between the contact members in a manner similar to that described above. The contact members 50 of the conventional communication jack connector 48 are so positioned and shaped to electrically couple to the terminal surfaces 46 of the plug connector elements 42 of the conventional plug connector 40.

Figure 3:
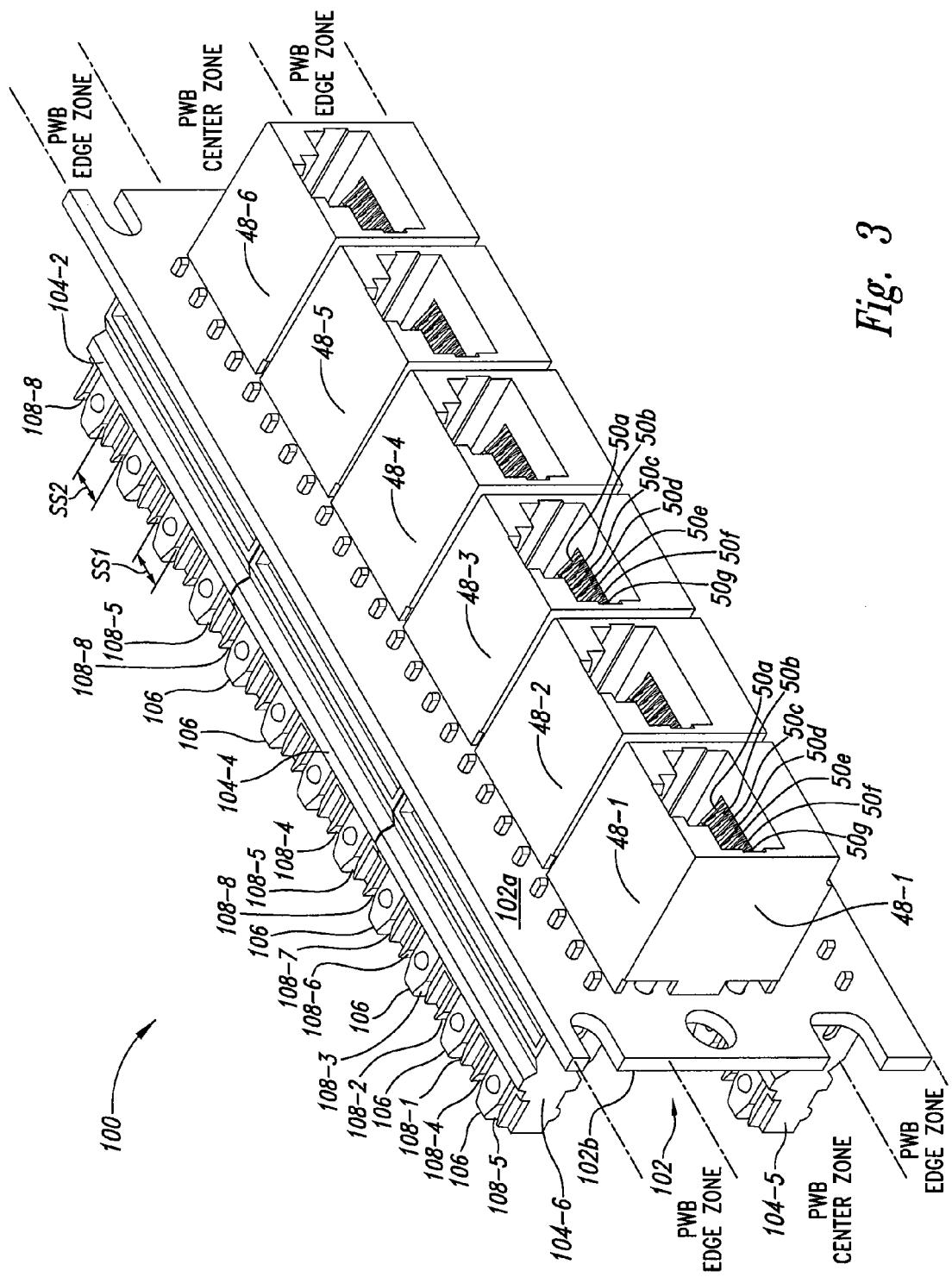
FIG. 3 is an isometric view of a reduced crosstalk patch panel of the present invention.

Six jack connectors 48-1 through 48-6 are shown in FIG. 3 as being part of a reduced crosstalk patch panel 100, which is subject of the present invention. The patch panel 100 further includes a circuit board 102 having a first side 102a to fixedly attach and electrically couple the six jack connectors 48. The circuit board 102 has a second side 102b to fixedly attach and electrically couple six insulation displacement connectors (IDCs) 104-1 through 104-6.

Figure 4:
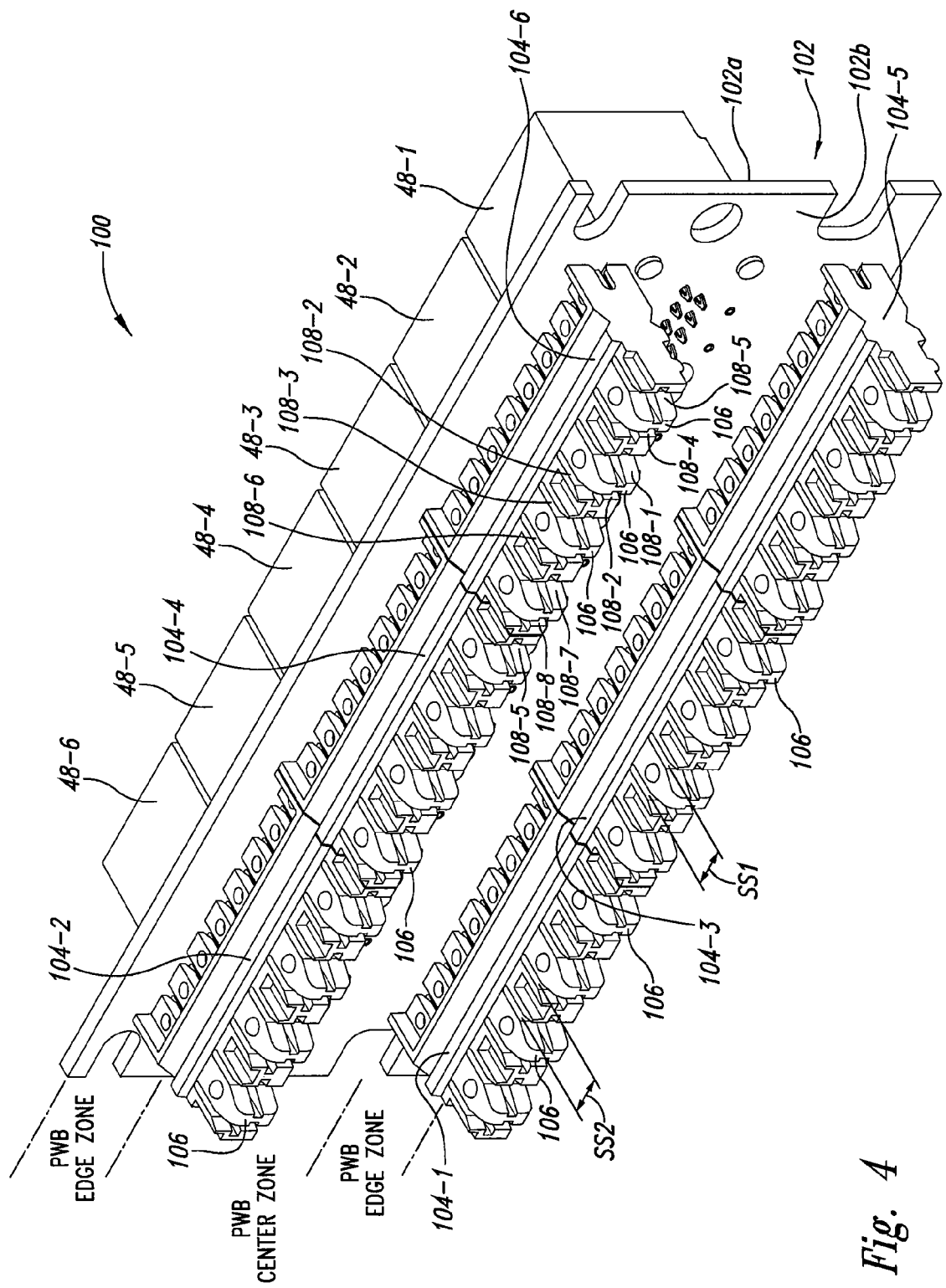
FIG. 4 is an isometric view of the reverse side of the patch panel of FIG. 3.

As better shown in FIG. 4, each of the IDCs 104 has four separators 106 with each separator having a wire slot 108 on either side of the separator to receive two wire ends (not shown) of a conductor wire pair per each of the separators. When each of the wire slots 108 receives one of the wire ends, the wire end becomes electrically coupled to a connector element (not shown) of the IDCS 104 that is electrically coupled to the circuit board 102 as further explained below. Consequently, each exemplary IDC 104 has eight wire slots 108-1 through 108-8 corresponding to pins 1 through 8, respectively, that are electrically coupled through the circuit board 102 to contact members 50a–50h, respectively, of one of the jack connectors 48 corresponding to pins 1 through 8, respectively.

As discussed, implementations reduce near end cross talk (NEXT) through added capacitance so that slot spacing ss1 between wire slots 108-1–108-2, 108-3–108-6, 108-5–108-4, and 108-7–108-8 and slot spacing ss2 between 108-2–108-3, 108-4–108-5, 108-6–108-7, and 108-8–108-1 can be the same as conventional IDC contact spacing such as for category 5 implementations in which the spacing is 0.150 inches with a tolerance of plus/minus 0.005 inches or a smaller tolerance such as of plus/minus 0.003 inches while still satisying the NEXT requirements of the Category 6 specification involving the NEXT limit line described above.

In the exemplary embodiment of FIG. 3, the jack connectors 48 of the patch panel 100 conform to the industry standard specifications for an RJ45 jack as controlled by the Federal Communications Commission under Title 47, Part 68. Performance of exemplary implementations of the patch panel 100 is also to conform to Telephone Industries Association Category 5 and 6 enhanced standards. However, the principles discussed are applicable to other patch panels using other communication connectors.

The industry standard external configuration allows the jack connectors 48 of the patch panel 100 to readily connect with an industry standard version of the plug connector 40, such as shown in FIG. 2E. While described as a jack connector, it is noted that the jack connectors 48 of the present invention may take the form of a plug or a receptacle, or any other style connector to physically mate with a corresponding communication connector prone to produce crosstalk. The patch panel 100 is configured to provide compensation for both forward and reverse crosstalk originating in the conventional plug connectors 40 as near-end crosstalk or in circuits on the IDC side of the patch panel as far-end crosstalk.

The conventional development of Category 6 component compliant patch panels per TIA-568-B.2-1 for near-end crosstalk involves understanding the nature of the crosstalk created in RJ45 plugs and applying cancellation techniques in the patch panels. The cancellation techniques include introducing crosstalk of opposite polarity to that created in the plug connector through capacitance and inductance added and/or modified in the patch panel.

Factors that add and/or modify capacitance and inductance in the patch panel include arrangement of tines of jack connectors, sizing of jack connectors, placement of signal traces found within the circuit board 102 and the IDCs 104, and adding interdigitated capacitors found within the circuit board.

As discussed, twisted pair signaling uses pairs of wires with a first wire of the pair designated as "tip" and the second wire of the pair designated as "ring." The voltage and currents found on each "tip" wire and each "ring" wire of a pair are of opposite polarity where the "tip" wire of a "tip"-"ring" pair of wires is at a positive voltage relative to the "ring" wire of the pair. These opposite polarity aspects of twisted pair signaling are used by the described implementations to reduce crosstalk. In particular, to compensate for crosstalk caused by a first capacitive coupling between two wires, a second capacitive coupling between the two wires can be purposefully added at a second location to produce crosstalk having a magnitude opposite to the crosstalk found at the first location. Since the first coupling and the second coupling result in crosstalk with opposite polarity, the crosstalk associated with the first coupling and the crosstalk associated with the second coupling tend to cancel each other resulting in substantially reduced levels of crosstalk.

Thus, to compensate for a first crosstalk originating in the plug connector 40, a second crosstalk could be introduced at the patch panel 100 of an equal amount and with an opposite polarity with respect to the first crosstalk. Some conventional jack designs use capacitive coupling of a polarity opposite to the polarity of unwanted coupling found in the conventional plug connector 40 to deliberately introduce crosstalk having polarity opposite to the polarity of the unwanted crosstalk originating in the conventional plug connector.

According to the terminology used herein, capacitive coupling between two wires of the same polarity, such as between two "tip" wires or between two "ring" wires, is referred to as positive capacitive coupling, whereas capacitive coupling between two wires of opposite polarity, such as between a "tip" wire and a "ring" wire, is referred to as negative capacitive coupling. Capacitance produced with parallel plates and capacitance produced by closely spaced lengths of wire are conventional methods used to achieve capacitive coupling opposite in polarity of and to compensate for unwanted capacitive coupling. Conventional approaches have taken an approach in mitigating crosstalk that crosstalk between various conductor pairs of the plug connectors could be considered as having nearly identical magnitudes and thus symmetrically arranged.

Implementations of the patch panel 100 capacitively compensate the IDC 104. In order to explain how this is done a review of the physical pin order of the conventional plug connector 40 and the conventional physical pin order of the wire slots 108 of the IDC 104 would be helpful. As shown in FIG. 2D, the physical pin order for the conventional plug connector 40 is pin 1 tip (1T), pin 2 ring (2R), pin 3 tip (3T), pin 4 ring (4R), pin 5 tip (5T), pin 6 ring (6R), pin 7 tip (7T), and pin 8 ring (8R). The conventional physical pin order for the wire slots 108 of the IDC 104 is 5T, 4R, 1T, 2R, 3T, 6R, 7T, and 8R (not shown). Given the physical pin order of the IDC 104, pin pairs adjacent other pin pairs are most influenced by the capacitive properties of the IDC, that is, pin 4–pin 5 pair adjacent pin 1–pin 2 pair (45-12 pair combination), pin 1–2 pair adjacent pin 3–pin 6 pair (12-36 pair combination), and pin 3–pin 6 pair adjacent pin 7–pin 8 pair (36-78 pair combination).

Figure 5:
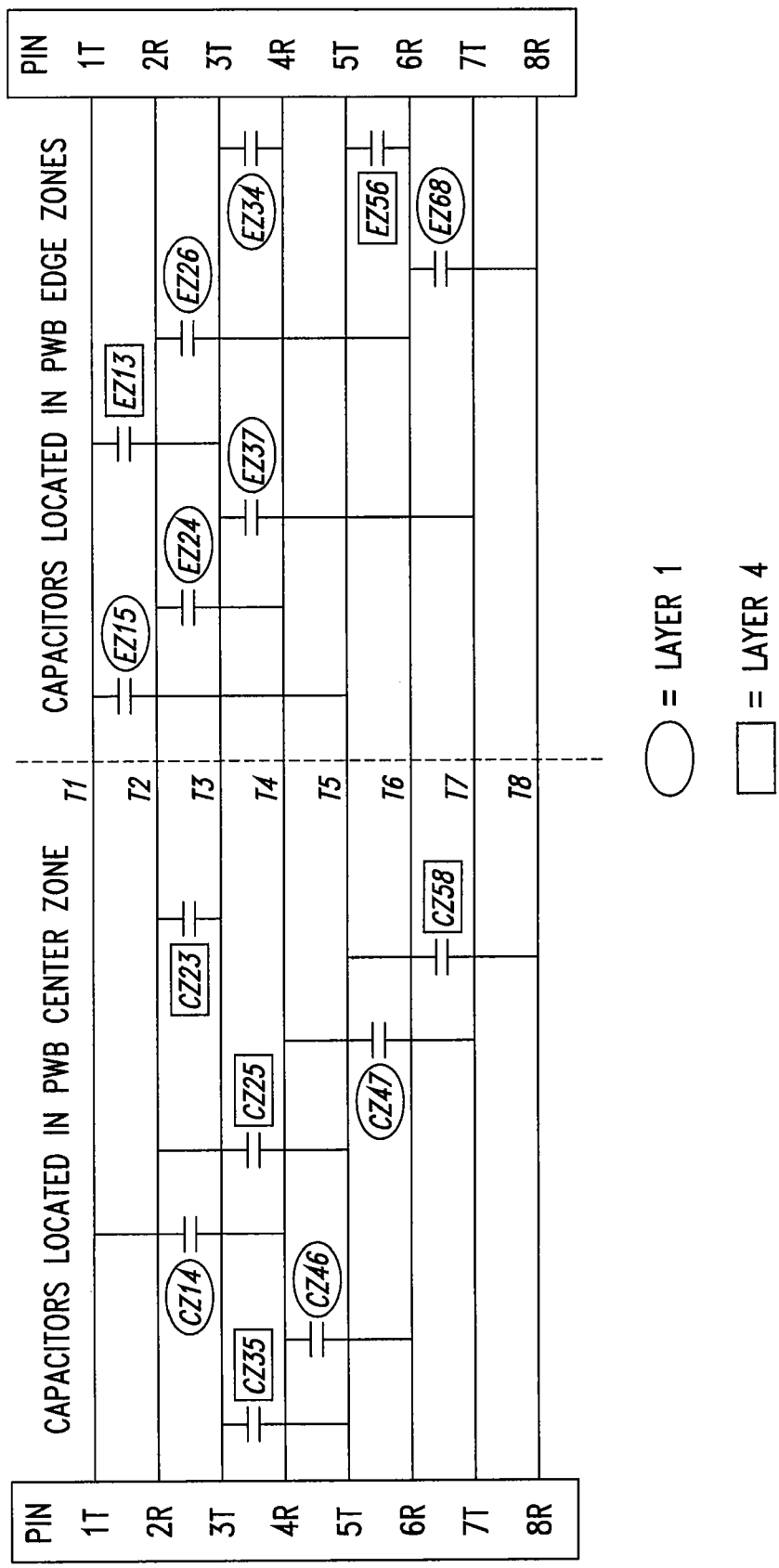
FIG. 5 is an electrical schematic of a first exemplary implementation of the patch panel of FIG. 3.

Given the conventional physical pin order of the conventional plug connector 40 and the conventional physical pin order of the wire slots 108 of the IDC 104 as described above, the following is provided to describe how capacitances in the IDC 104 resulting from these adjacent pin pair combinations are addressed. For the 45-12 pair combination, pin 4R and pin 1T are nearest each other and dominate the capacitive coupling due to their proximity in the IDC 104. The polarity of the crosstalk is the opposite of that created in the conventional plug connector 40 for this pair combination. Unfortunately, the IDC pair combination is electrically too far away to effectively cancel the plug crosstalk. As a result, this IDC crosstalk is locally canceled in the IDC 104 and cancellation of the plug crosstalk applied nearer to the plug/tine interface. To address this IDC crosstalk, one interdigitated capacitor, EZ15, as shown in FIG. 5, is added to electrically couple between pin 5T and pin 1T of the IDC 104 and one interdigitated capacitor, EZ24, is added to electrically couple between pin 4R and pin 2R.

For the 12-36 pair combination, pin 2R and pin 3T are nearest each other and dominate the capacitor coupling due to their proximity in the IDC 104. The polarity of this crosstalk is the same as that created in the conventional plug connector 40 for the 12-36 pair combination. As a result, much of this crosstalk must be canceled. Some same-polarity capacitance at this location is used in combination with a capacitor of opposite polarity at the interface (not shown) of the slots 108 and the circuit board 102 to provide a more effective cancellation of the plug crosstalk. Use of the IDC capacitance in this way helps to minimize the size of crosstalk canceling capacitors. The capacitive crosstalk created within this IDC pair combination is partially canceled by applying interdigitated capacitance. Two capacitors are used: one, EZ13, between pin 1T and pin 3T and one, EZ26, between pin 2R and pin 6R. The size of these capacitors is small as possible to reduce the return loss penalty incurred due to the lower than normal impedance of the IDC 104.

For the 36-78 pair combination, pin 6R and pin 7T are nearest each other and dominate the capacitive coupling due to their proximity in the IDC 104. The polarity of this crosstalk is the same as that created in the conventional plug connector 40 for this pair combination. As result, much of this crosstalk must be canceled similarly as done with the 12-36 pair combination discussed above. Two capacitors are used, one, EZ37, between pin 3T and pin 7T and one, EZ68, between pin 6R and pin 8R. The size of these capacitors is kept as small as possible to reduce the return loss penalty incurred due to the lower than normal impedance of the IDC 104. As shown in FIG. 5, other interdigitated capacitors are added to the circuit board 102 to address crosstalk produced in areas other than the IDC 104.

Additionally, signal routing at the interface of the circuit board 102 and the IDC 104 can include aspects to improve the return loss performance of the IDC. In some implementations, the IDC 104 has inherently low impendance due to the close proximity and relatively large area of its contacts. To counter this low impedance, a high impedance section of each of the pairs: pin 4–pin 5, pin 1–pin 2, pin 3–pin 6, and pin 7–pin 8, is included near this interface of the circuit board 102 and the IDC 104. Each high impedance section is made by increasing the space between the traces of each of the pairs, which also helps to improve NEXT performance.

How values for the added capacitances are determined for a given configuration of the patch panel 100 can be based upon an iterative process where capacitance is added to the circuit board, measurements are made, and then further addition or subtraction of capacitance is done depending upon analysis and so on. An iterative approach can be useful to determine proper capacitances to be added to the circuit board 102 since values for the inherent capacitances in the plug connector 40 and the IDC 104 may be affected by capacitances found elsewhere. With some exemplary implementations, refinements to determine proper values to use for the capacitances to be added to the circuit board 102 can be accomplished through an iterative process utilizing both electromagnetic simulation modeling software with finite element analysis known in the art and furnished by Ansoft Corporation, Pittsburgh, Pa. running on an HP J5000 Unix computer and with electronic test analyzer equipment furnished by Hewlett Packard Corporation including models HP 4380S96, HP 4396B, and HP 4380A. For some tests, the test analyzer was connected to wire pairs 1–4 connected to the plug connector 40. The plug connector 40 was coupled to the patch panel 100 through the physical engagement mechanism of the jack connector 48.

With the mentioned exemplary implementation, the electromagnetic simulation modeling software can be generally used to test ideas for particular layout designs for the circuit board 102. The electronic test analyzer can be used further to test design layouts and to further refine layout dimensions to achieve reductions in crosstalk. The test analyzer can be used to send signals to the patch panel 100 through the conventional plug connector 40 on a first pair of wires connected to the conventional plug connector and then can be used to measure resultant amounts of crosstalk occurring on second, third, and fourth pairs of wires connected to the patch panel. Both near-end crosstalk and far-end crosstalk can be measured and refinements to the circuit board 102 can be made until reductions in both near-end crosstalk and far-end crosstalk to satisfy category 6 performance were achieved with the patch panel 100 coupled to the conventional plug connector 40.

Figure 6:
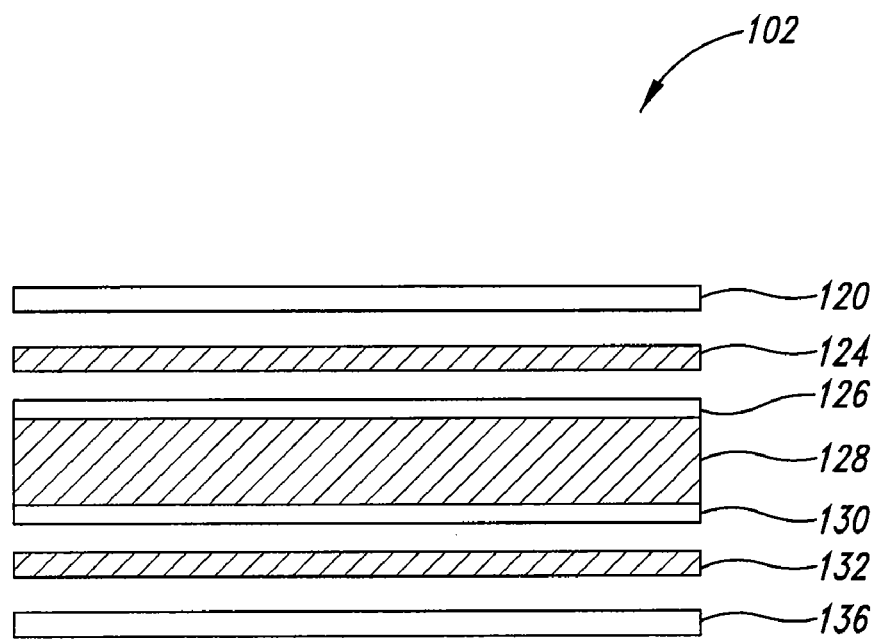
FIG. 6 is a schematic diagram showing an exemplary lamination sequence for the circuit board of the patch panel of FIG. 3.

An exemplary implementation of the circuit board 102 is shown in FIG. 6 as having first and fourth wire trace layers 120 and 136 made from 2.0 oz finished copper, second and third wire trace layers 126 and 130 made from 2.0 oz finished copper, a first dielectric layer 128 being 0.028 inches thick and having a dielectric constant of 4.0, and first and second bonding material layers 124 and 132 being 0.009 inches thick. As shown in FIG. 6, an order of layering for the circuit board 102 is as follows: the first wire trace layer 120, the first bonding material layer 124, the second wire trace layer 126, the first dielectric layer 128, the third wire trace layer 130, the second bonding material layer 132, and the fourth wire trace layer 136.

Figure 7:
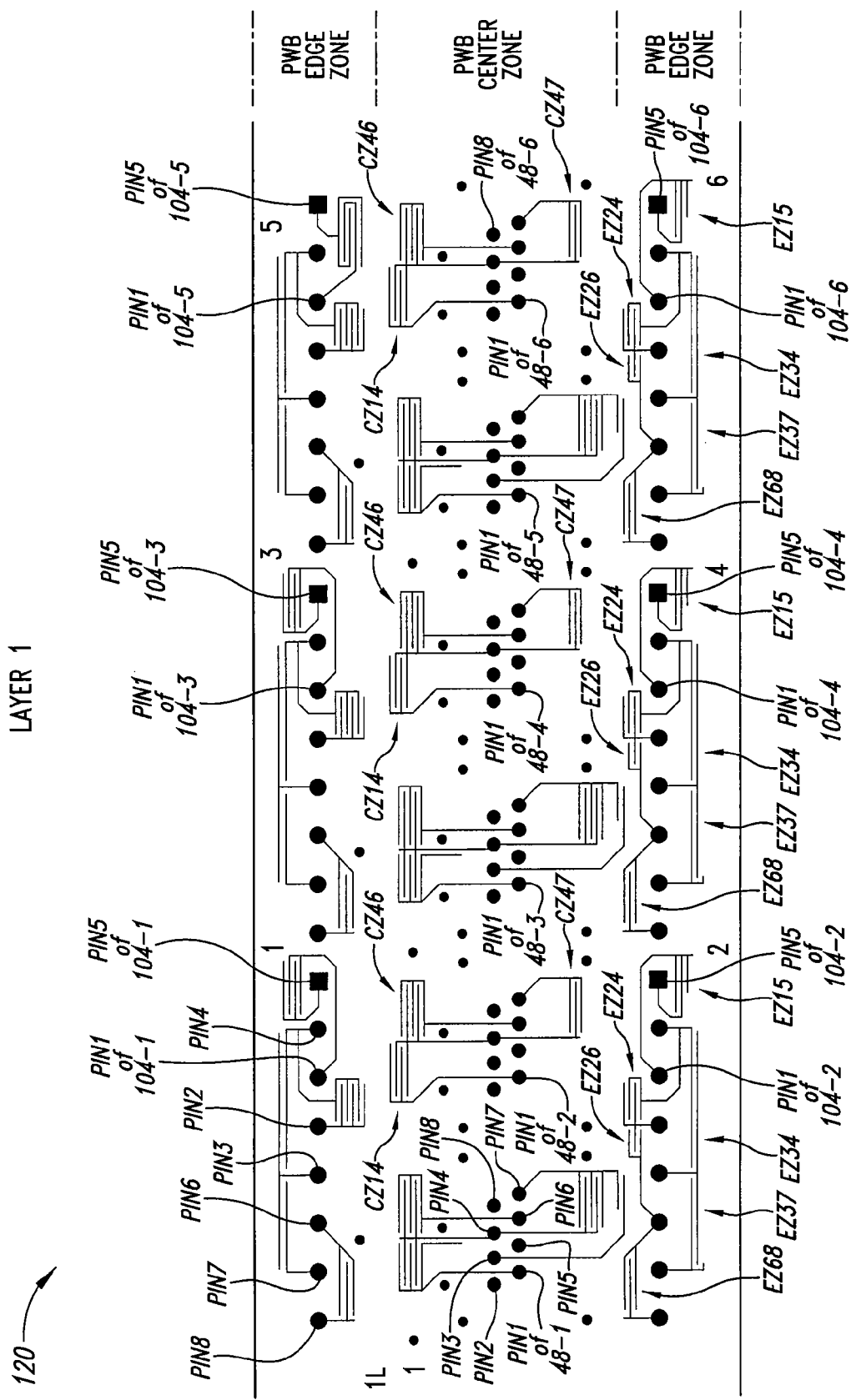
FIG. 7 is a schematic diagram showing the first wire trace layer of the lamination sequence of FIG. 6.

The wire trace of the first wire trace layer 120 of the depicted implementation is shown in FIG. 7. The first wire trace layer 120 includes a first plurality of wire connector pads (referred to herein as "the plurality of jack pads"). Selected pads of the plurality of jack pads are labeled in FIG. 7 with the pin number and jack connector number of the contact member 50 of the jack connector 48 to which the pad is electrically coupled. For example, one of the plurality of jack pads shown on FIG. 7 and labeled pin 1 of 48-4 would be electrically coupled to the contact member 50a associated with pin 1 of the jack connector 48-4 of the patch panel 100.

The first wire trace layer 120 also includes a second plurality of wire connector pads (referred to herein as "the plurality of IDC pads"). Selected pads of the plurality of IDC pads are labeled in FIG. 7 with the pin number associated with one of the wire slots 108 and its connector element (such as pin 1 is associated with wire slot 108-1 and its connector element) of the IDC 104. For example, one of the plurality of IDC pads shown in FIG. 7 and labeled pin 1 of 104-4 would be electrically coupled to the connector element associated with the wire slot 108-1 of the IDC 104-4 of the patch panel 100. The plurality of jack pads and the plurality of IDC pads are similarly labeled on the second, third, and fourth wire trace layers 126, 130, and 136 shown in FIGS. 8, 9, and 10, respectively, and extend through holes formed in the circuit board 102.

One purpose for the first wire trace layer 120 is to add capacitive coupling using interdigitated wire traces as is done with capacitive wire trace portions shown in FIG. 7 providing the CZ14, CZ46, CZ47, EZ15, EZ24, EZ26, EZ34, EZ37, and EZ68 board capacitances shown as part of the circuit diagram of FIG. 5.

Figure 8:
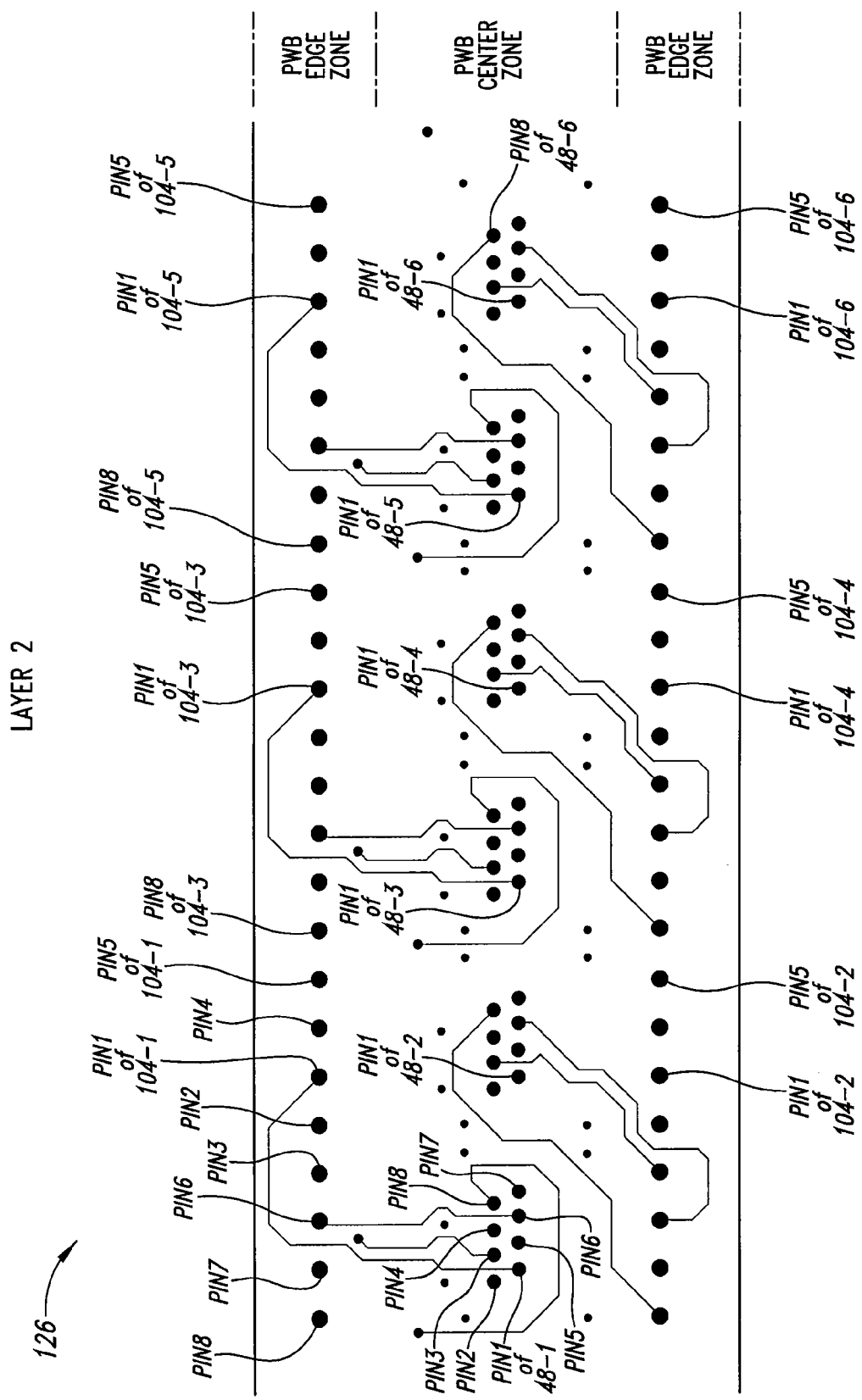
FIG. 8 is a schematic diagram showing the second wire trace layer of the lamination sequence of FIG. 6.
Figure 9:
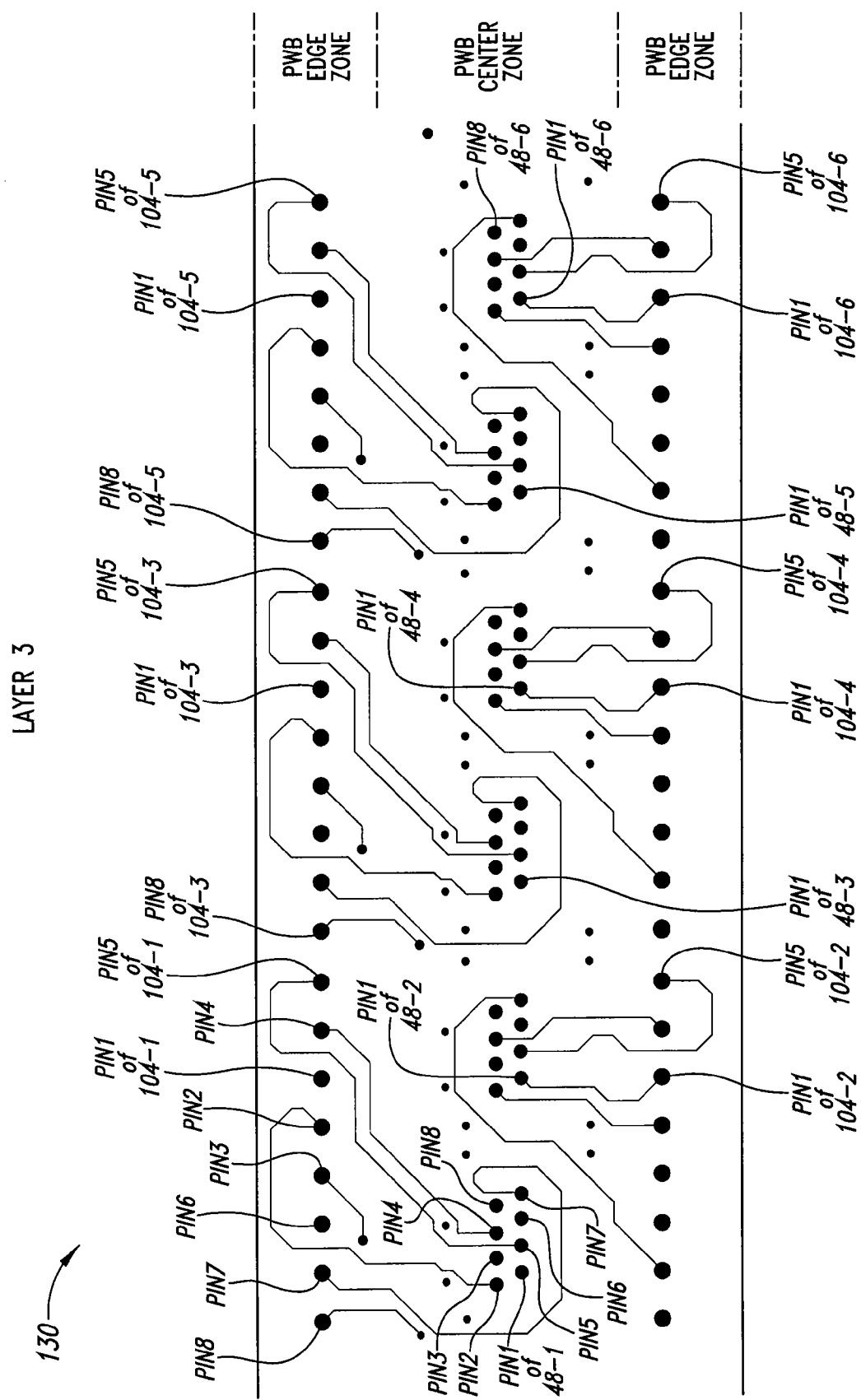
FIG. 9 is a schematic diagram showing the third wire trace layer for the lamination sequence of FIG. 6.

The second wire trace layer 126 is shown in FIG. 8 and the third wire trace layer 130 is shown in FIG. 9 as having wire trace connections between the plurality of jack pads and the plurality of IDC pads, each connection corresponding to a particular pin number of a particular jack and its corresponding IDC. For instance, as shown in FIG. 8, a connection exists between pin 2 of 48-1 and pin 2 of 104-1.

Figure 10:
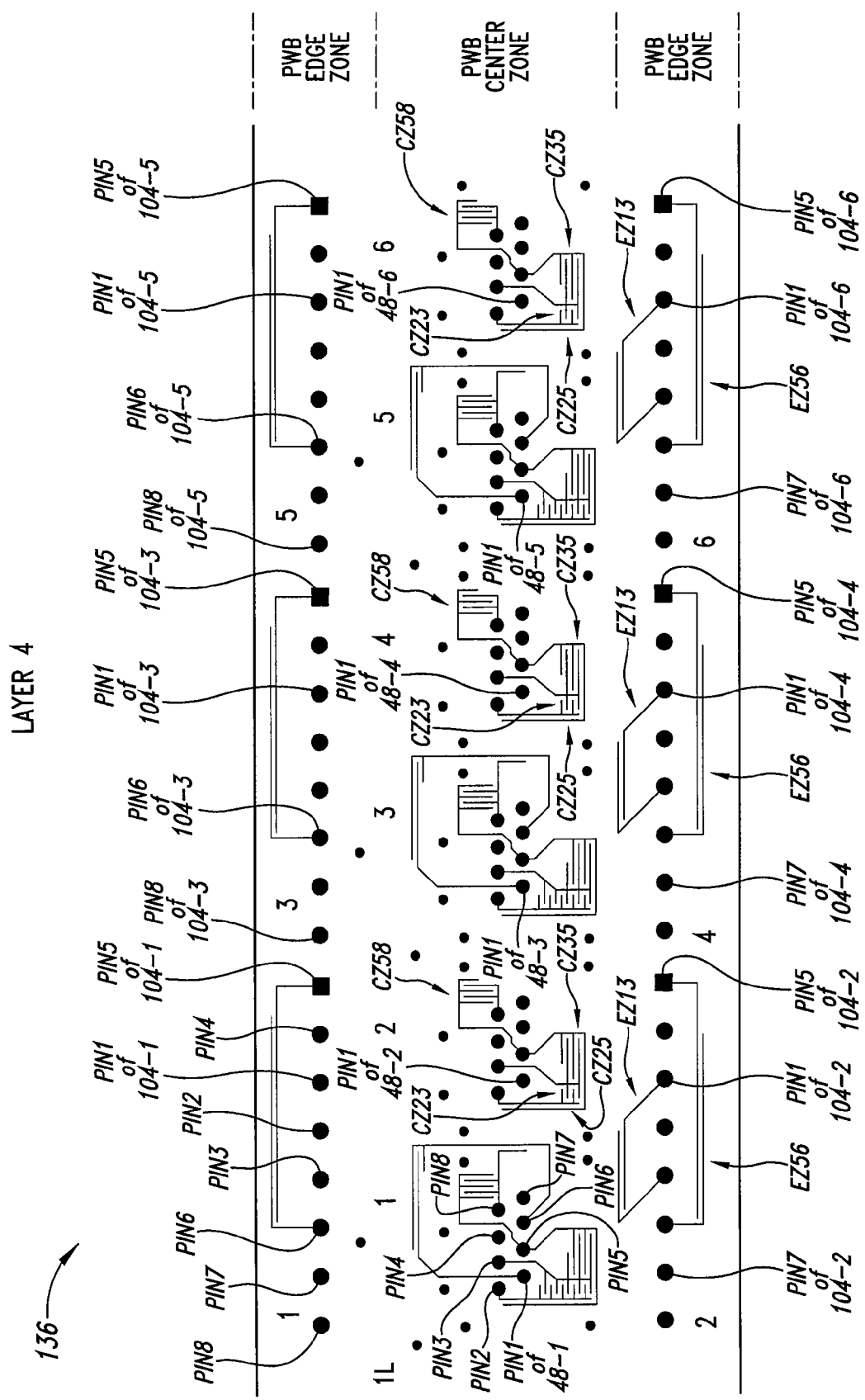
FIG. 10 is a schematic diagram showing the fourth wire trace layer for the lamination sequence of FIG. 6.

In FIG. 10, exemplary implementations of compensation are shown only for jack connectors 48-2, 48-4, and 48-6 and not for jack connectors 48-1, 48-3, and 48-5. The fourth wire trace layer 136 adds capacitive coupling with capacitive wire trace portions shown in FIG. 10 providing the EZ13, CZ23, CZ25, CZ35, EZ56, and CZ58 capacitances for the jack connectors 48-2, 48-4, and 48-6, but not for the jack connectors 48-1, 48-3, and 48-5. For the exemplary circuit board 102 of FIGS. 6–10, none of the center zone or edge zone capacitances depicted in FIG. 5 have been implemented for the jack connectors 48-1, 48-3, and 48-5. Further implementations of the patch panel 100 also use interdigitated wire traces to add capacitance whereas other embodiments use other ways of adding capacitance known in the art such as through discrete capacitive components.

It should also be noted that the patch panel 100 can be made in a wall mount version and other versions including those that are free-standing. The principles of the present invention are intended to encompass all such variations of communication connectors. In addition, the present invention is intended to encompass communication connectors other than the RJ45 style, and may be designed to include a greater or lesser number of twisted pair cables.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A system for a plug connector, a first wire end, a second wire end, a third wire end, a fourth wire end, the plug connector having a first plurality of plug connector elements each connected to a different tip wire, the plug connector having a second plurality of plug connector elements each connected to a different ring wire, the system comprising:

a jack connector shaped to engage with the plug connector, the jack connector having a plurality of jack contact members positioned and shaped to electrically couple to the plug connector elements when the plug connector is engaged with the jack connector;

an insulation displacement connector (IDC) having a plurality of wire slots including a first wire slot to receive the first wire end, a second wire slot to receive the second wire end, a third wire slot to receive the third wire end, and a fourth wire slot to receive the fourth wire end, the second wire slot positioned between the first wire slot and the fourth wire slot and adjacent the first wire slot, the third wire slot positioned between the first wire slot and the fourth wire slot and adjacent the fourth wire slot, the second wire slot positioned adjacent the third wire slot; and a circuit board having a plurality of jack pads, a plurality of IDC pads, a plurality of wire trace connections, a first board capacitance and a second board capacitance, the plurality of IDC pads including a first IDC pad, a second IDC pad, a third IDC pad and a fourth IDC pad, each of the jack pads electrically coupled to a different one of the jack contact members of the jack connector, each of the IDC pads configured to electrically couple to a different one of the wire ends received by the IDC, each of the jack pads electrically coupled to a different one of the IDC pads via a different one of the wire trace connections, when the first wire ends is received by the first wire slot and when the third wire end is received by the third wire slot, the first wire end electrically coupled via in part the first IDC pad and the third wire end electrically coupled via in part the third IDC pad to a different one of the plug connectors of the first plurality of plug connectors when the plug connector is engaged with the jack connector, when the second wire ends is received by the second wire slot and when the fourth wire end is received by the fourth wire slot, the second wire end electrically coupled via in part the second IDC pad and the fourth wire end electrically coupled via in part the fourth IDC pad to a different one of the plug connectors of the second plurality of plug connectors when the plug connector is engaged with the jack connector, when the second wire ends is received by the second wire slot and when the third wire end is received by the third wire slot, the second wire slot, the second wire end and the third wire end having a negative capacitive coupling therebetween when the plug connector is engaged with the jack connector, the first board capacitance coupled between the first IDC pad and the third IDC pad and the second board capacitance coupled between the second IDC pad and the fourth IDC pad to at least in part compensate with positive capacitive coupling from the first board capacitance and the second board capacitance the negative capacitive coupling between the second wire slot and the third wire slot.

2. The system of claim 1 wherein the first board capacitance and the second board capacitance are interdigitated wire traces.

3. The system of claim 1 wherein the jack connector is configured to engage with the plug connector as an RJ45 jack connector.

4. A system for a plug connector, a first wire end, a second wire end, a third wire end, a third wire end, and a fourth wire end, the plug connector having a first plurality of plug connector elements each connected to a different tip wire, the plug connector having a second plurality of plug connector elements each connected to a different ring wire, the system comprising:
    a jack connector shaped to engage with the plug connector, the jack connector having a plurality of jack contact members positioned and shaped to electrically couple to the plug connector elements when the plug connector is engaged with the jack connector;
    an insulation displacement connector (IDC) to receive the first wire end, the second wire end, the third wire end, and the fourth wire end in a first manner, when received by the IDS in the first manner, the second wire end positioned between the first wire end and the fourth wire end and end and adjacent the first wire end, the third wire end positioned between the first wire end and the fourth wire end and adjacent the fourth wire end, the second wire end positioned adjacent the third wire end; and
    a circuit board having a plurality of jack pads, a plurality of IDC pads, a plurality of wire trace connections, and a first board capacitance, the plurality of IDC pads including a first IDC pad, a second IDC pad, a third IDC pad and a fourth IDC pad, each of the jack pads electrically coupled to a different one of the jack contact members of the jack connector, when the wire ends are received by the IDC in the first manner, the IDC pads electrically coupled to a different one of the wire ends, each of the jack pads electrically coupled to a different one of the IDC pads via a different one of the wire trace connections, when received by the IDC in the first manner, the first wire end electrically coupled via in part the first IDC pad and the third wire end electrically coupled via in part the third IDC pad to a different one of the plug connectors of the first plurality of plug connectors when the plug connector is engaged with the jack connector, when received by the IDC in the first manner, the second wire end electrically coupled via in part the second IDC pad to one of the plug connectors of the second plurality of plug connectors when the plug connector is engaged with the jack connector, when received by the IDC in the first manner, the second wire end and the third wire end having a negative capacitive coupling therebetween when the plug connector is engaged with the jack connector, the first board capacitance coupled between the first IDC pad and the third IDC pad to at least in part partially compensate with positive capacitive coupling from the first board capacitance the negative capacitive coupling between the second wire end and the third wire end.

5. A system for a plug connector, a first wire end, a second wire end, a third wire end, and a fourth wire end, the plug connector having a first plurality of plug connector elements each connected to a different tip wire, the plug connector having a second plurality of plug connector elements each connected to a different ring wire, the system comprising:
    a jack connector shaped to engage with the plug connector, the jack connector having a plurality of jack contact members positioned and shaped to electrically couple to the plug connector elements when the plug connector is engaged with the jack connector;
    an insulation displacement connector (IDC) having a plurality of wire slots to received the first wire end, the second wire end the third wire end, and the fourth wire end in a first manner, when received by the IDC in the first manner the second wire end positioned between the first wire end and the fourth wire end and adjacent the first wire end, the third wire end positioned between the first wire end and the fourth wire end and adjacent the fourth wire end, the second wire end positioned adjacent the third wire end; and
    a circuit board having a plurality of jack pads, a plurality of IDC pads, a plurality of wire trace connections, and a first board capacitance, the plurality of IDC pads including a first IDC pad, a second IDC pad, a third IDC pad and a fourth IDC pad, each of the jack pads electrically coupled to a different one of the jack contact members of the jack connector, when the wire ends are received by the IDC in the first manner, each of the IDC pads electrically coupled to a different one of the wire ends, each of the jack pads electrically coupled to a different one of the IDC pads via a different one of the wire trace connections, when received by the IDC in the first manner, the first wire end electrically coupled via in part the first IDC pad and the third wire end electrically coupled via in part the third IDC pad to a different one of the plug connectors of the first plurality of plug connectors when the plug connector is engaged with the jack connector, when received by the IDS in the first manner, the second wire end electrically coupled via in part the second IDC pad and the fourth wire end electrically coupled via in part the fourth IDC pad to a different one of the plug connectors of the second plurality of plug connectors when the plug connector is engaged with the jack connector, when received by the IDC in the first manner, the second wire end and the third wire end having a negative capacitive coupling therebetween when the plug connector is engaged with the jack connector, the first board capacitance coupled between the second IDC pad and the fourth IDC pad to at least in part partially compensate with positive capacitive coupling from the first board capacitance the negative capacitive coupling between the second wire end and the third wire end.

6. A method for a plug connector, a first wire end, a second wire end, a third wire end, and a fourth wire end, the plug connector having a first plurality of plug connector elements each connected to a different tip wire, the plug connector having a second plurality of plug connector elements each connected to a different ring wire, the method comprising:
    providing a jack connector shaped to engage with the plug connector, the jack connector having a plurality of jack contact members positioned and shaped to electrically couple to the plug connector elements when the plug connector is engaged with the jack connector;
    providing an insulation displacement connector (IDC) having a plurality of wire slots to received the wire ends, when received by the IDC in a first manner, the second wire end positioned between the first wire end and the fourth wire end and adjacent the first wire end, the third wire end positioned between the first wire end and the fourth wire end and adjacent the fourth wire end, the second wire end positioned adjacent the third wire end;

providing a circuit board having a plurality of jack pads, a plurality of IDC pads, a plurality of wire trace connections, the plurality of IDC pads including a first IDC pad, a second IDC pad, a third IDC pad and a fourth IDC pad, each of the jack pads electrically coupled to a different one of the jack contact members of the jack connector, when the wire ends are received by the IDC in the first manner, each of the IDC pads electrically coupled to a different one of the wire ends, each of the jack pads electrically coupled to a different one of the IDC pads via a different one of the wire trace connections, when received by the IDC in the first manner, the first wire end electrically coupled via in part the first IDC pad and the third wire end electrically coupled via in part the third IDC pad to a different one of the plug connectors of the first plurality of plug connectors when the plug connector is engaged with the jack connector, when received by the IDC in the first manner, the second wire end electrically coupled via in part the second IDC pad and the fourth wire end electrically coupled via in part the fourth IDC pad to a different one of the plug connectors of the second plurality of plug connectors when the plug connector is engaged with the jack connector, when received by the IDC in the first manner, the second wire end and the third wire end having a negative capacitive coupling therebetween when the plug connector is engaged with the jack connector;

providing a first board capacitance and a second board capacitance;

coupling the first board capacitance between the first IDC pad and the third IDC pad; and coupling the second board capacitance between the second IDC pad and the fourth IDC pad to at least in part partially compensate with positive capacitive coupling from the first board capacitance and the second board capacitance the negative capacitive coupling between the second wire end and the third wire end.

* * * * *